United States Patent
Tseng et al.

(10) Patent No.: US 8,624,366 B2
(45) Date of Patent: Jan. 7, 2014

(54) SEMICONDUCTOR PACKAGE STRUCTURE AND METHOD OF FABRICATING THE SAME

(75) Inventors: Tzyy-Jang Tseng, Taoyuan (TW); Dyi-Chung Hu, Taoyuan (TW); Yu-Shan Hu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 13/456,660

(22) Filed: Apr. 26, 2012

(65) Prior Publication Data
US 2012/0273930 A1 Nov. 1, 2012

(30) Foreign Application Priority Data

Apr. 27, 2011 (TW) .............................. 100114747 A

(51) Int. Cl.
*H01L 23/495* (2006.01)
(52) U.S. Cl.
USPC ........... 257/675; 257/691; 257/706; 257/796; 438/112
(58) Field of Classification Search
USPC .................. 257/675, 691, 706, 796, E23.033, 257/E21.599; 438/112
See application file for complete search history.

(56) References Cited

U.S. PATENT DOCUMENTS 7,241,645 B2 * 7/2007 Zhao et al. ..................... 438/122
8,097,943 B2 * 1/2012 Badakere et al. ............. 257/691

\* cited by examiner

*Primary Examiner* — Theresa T Doan
(74) *Attorney, Agent, or Firm* — Edwards Wildman Palmer LLP; Peter F. Corless; Steven M. Jensen

(57) ABSTRACT

A semiconductor package structure is provided, including: a semiconductor chip having electrode pads disposed thereon and metal bumps disposed on the electrode pads; an encapsulant encapsulating the semiconductor chip; a dielectric layer formed on the encapsulant and having a plurality of patterned intaglios formed therein for exposing the metal bumps; a wiring layer formed in the patterned intaglios of the dielectric layer and electrically connected to the metal bumps; and a metal foil having a plurality of metal posts disposed on a surface thereof such that the metal foil is disposed on the encapsulant with the metal posts penetrating the encapsulant so as to extend to the inactive surface of the semiconductor chip. Compared with the prior art, the present invention reduces the overall thickness of the package structure, increases the electrical transmission efficiency and improves the heat dissipating effect.

5 Claims, 5 Drawing Sheets

US 8,624,366 B2

SEMICONDUCTOR PACKAGE STRUCTURE AND METHOD OF FABRICATING THE SAME

CROSS-REFERENCES TO RELATED APPLICATIONS

This application claims under 35 U.S.C. §119(a) the benefit of Taiwanese Application No. 100114747, filed Apr. 27, 2011, the entire contents of which is incorporated herein by reference.

BACKGROUND OF THE INVENTION

1. Field of the Invention

The present invention relates to semiconductor package structures and methods of fabricating the same, and, more particularly, to a semiconductor package structure having reduced thickness and a method of fabricating the same.

2. Description of Related Art

While electronic products are becoming low-profiled and compact-sized, their package structures need to meet Joint Electronic Device Engineering Council (JEDEC) specifications. For example, although dynamic random access memory (DRAM) chips have been developed by a 40 nm (or less) process technology, the package structures of such chips need to be kept the same so as to have a ball pitch of 0.8 mm for PCB mounting. For such a package structure, a fan-out type wafer level packaging method can be used. In addition, DDR3 SDRAM (Double-Data-Rate Three Synchronous Dynamic Random Access Memory) is the latest computer memory specification, in which a window ball grid array (wBGA) packaging method can be used.

FIG. 1 is a cross-sectional view of a conventional wBGA semiconductor package structure. Referring to FIG. 1, the wBGA semiconductor package structure comprises a packaging substrate 10 and a semiconductor chip 11. The packaging substrate 10 has at least a cavity 100 formed therethrough. The semiconductor chip 11 has an active surface 11a and an opposite inactive surface 11b, and a plurality of electrode pads 111 are disposed on the active surface 11a. The semiconductor chip 11 is disposed on a surface of the packaging substrate 10 through the active surface 11a thereof so as to cover one end of the cavity 100. Then, through the use of wire bonding technology, a plurality of gold wires 12 are passed through the cavity 100 for electrically connecting the electrode pads 111 of the semiconductor chip 11 to conductive pads 13 formed on the other surface of the substrate 10. Further, a first encapsulant material 14 is formed to encapsulate the gold wires 12, and a second encapsulant material 15 is formed on the packaging substrate 10 to encapsulate the semiconductor chip 11. Finally, a plurality of solder balls 16 are disposed on the exposed conductive pads 13 of the packaging substrate 10. With this configuration, the overall height of the package structure (including the solder balls 16) is 1.1-1.2 mm.

However, in the above-described semiconductor package structure, the gold wires 12 passing through the cavity 100 for electrically connecting the electrode pads 111 of the semiconductor chip 11 and the conductive pads 13 on the other surface of the substrate 10 are quite long, thereby adversely affecting the signal transmission efficiency. Further, the gold wires 12 lead to higher material costs as the price of gold on the international market has risen significantly recently. Furthermore, since the gold wires 12 and the semiconductor chip 11 are encapsulated by the first encapsulant material 14 and the second encapsulant material 15, respectively, heat generated by the semiconductor chip 11 cannot be effectively dissipated. In addition, the package is not ideal for portable electronic products due to the relatively large thickness of the overall package structure.

Therefore, there is a need to provide a semiconductor package structure and a method of fabricating the same so as to overcome the above-described drawbacks.

SUMMARY OF THE INVENTION

In view of the above-described drawbacks, the present invention provides a semiconductor package structure having reduced thickness and increased reliability and a fabrication method thereof.

In order to achieve the above and other objectives, the present invention provides a semiconductor package structure, which comprises: a semiconductor chip having an active surface and an opposite inactive surface, a plurality of electrode pads formed on the active surface, and a plurality of metal bumps disposed on the electrode pads, respectively; an encapsulant encapsulating the semiconductor chip, with the active surface of the semiconductor chip being exposed therefrom; a dielectric layer formed on the active surface of the semiconductor chip and the encapsulant and having a plurality of patterned intaglios formed therein for exposing the metal bumps; a wiring layer formed in the patterned intaglios of the dielectric layer and electrically connected to the metal bumps, wherein the wiring layer extends to an area greater than the active surface of the semiconductor chip by means of the presence of the encapsulant and the dielectric layer; an insulating protective layer formed on the dielectric layer and the wiring layer and having a plurality of openings for exposing portions of the wiring layer; and a metal foil having a plurality of metal posts disposed on a surface thereof, wherein the metal foil is disposed on the encapsulant with the metal posts penetrating the encapsulant so as to extend to the inactive surface of the semiconductor chip, thereby effectively dissipating heat generated by the semiconductor chip to the ambient.

The present invention further provides a method of fabricating a semiconductor package structure, comprising: providing a carrier board having a first adhesive layer formed on a surface thereof; providing a plurality of semiconductor chips, each of which has an active surface and an opposite inactive surface, a plurality of electrode pads formed on the active surface, and a plurality of metal bumps disposed on the electrode pads, respectively; adhering the semiconductor chips to the first adhesive layer through the active surfaces thereof; forming an encapsulant on the first adhesive layer to encapsulate the semiconductor chips; providing a metal foil having a plurality of metal posts disposed on a surface thereof, and attaching the metal foil to the encapsulant through the surface thereof such that the metal posts penetrate the encapsulant and extend to the inactive surfaces of the semiconductor chips; removing the carrier board and the first adhesive layer; forming a dielectric layer on the encapsulant and the semiconductor chips, wherein the dielectric layer has a plurality of patterned intaglios formed therein for exposing the metal bumps, respectively; forming a wiring layer in the patterned intaglios of the dielectric layer such that the wiring layer is electrically connected to the metal bumps; forming an insulating protective layer on the dielectric layer and the wiring layer, wherein the insulating protective layer has a plurality of openings for exposing portions of the wiring layer; removing portions of the metal foil such that the metal foil is separated corresponding to the semiconductor chips to form dicing lines; and cutting the encapsulant, the dielectric layer and the insulating protective layer along the dicing lines of the metal foil such that a plurality of semiconductor package structures are formed.

Since the present invention uses the dielectric layer as the base of the semiconductor package structure and eliminates the need to use gold wires for electrical transmission as in the prior art, the overall thickness of the semiconductor package structure is reduced. Further, the metal posts extending to the inactive surface of the semiconductor chip can directly transfer heat generated by the semiconductor chip to the metal foil having a large area, thereby facilitating heat dissipation of the overall semiconductor package. Furthermore, by dispensing with the conventional long gold wires for electrical signal transmission, the present invention increases the electrical transmission efficiency, improves the reliability of final products and reduces material costs.

DETAILED DESCRIPTION OF PREFERRED EMBODIMENTS

The following illustrative embodiments are provided to illustrate the disclosure of the present invention, these and other advantages and effects will be apparent to those in the art after reading this specification.

Figure 1:
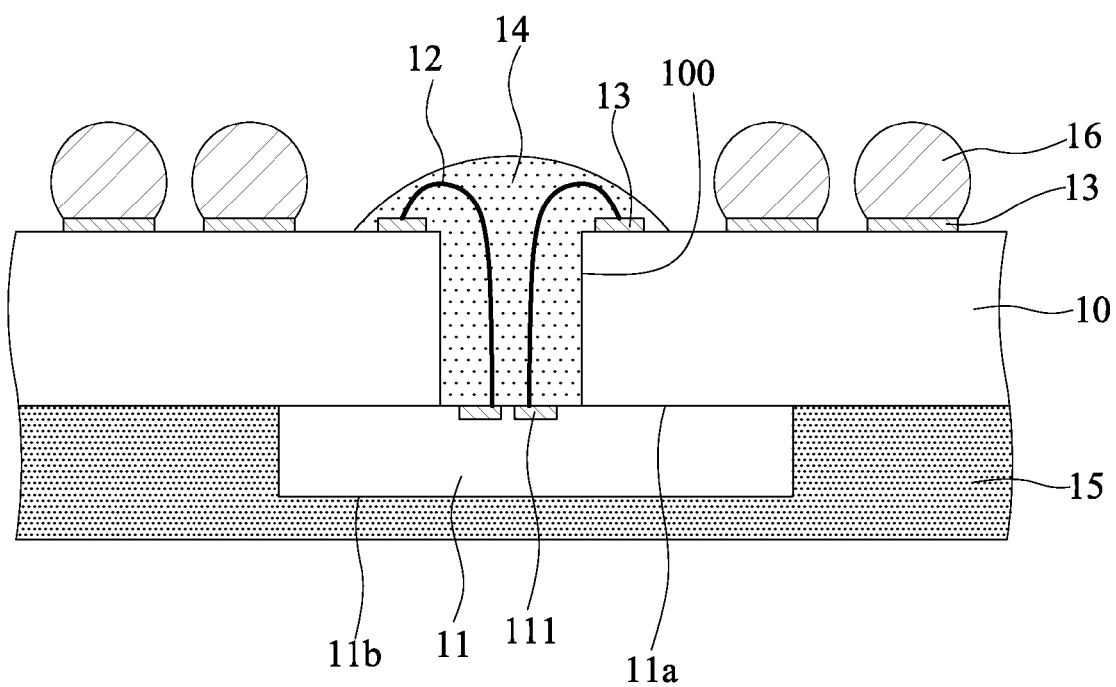
FIG. 1 is a cross-sectional view of a conventional wBGA semiconductor package structure.
Figure 2A:
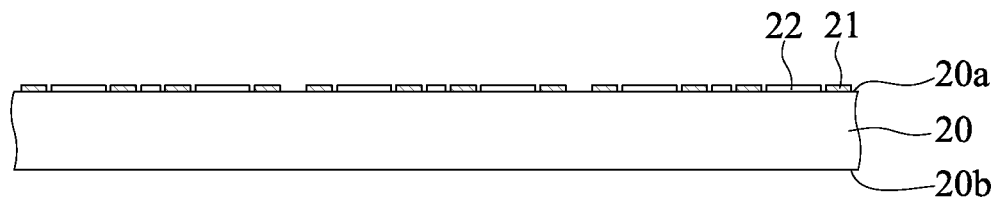
FIGS. 2A to 2C are cross-sectional views illustrating a semiconductor chip of a semiconductor package structure and a method of fabricating the same according to the present invention.
Figure 2B:
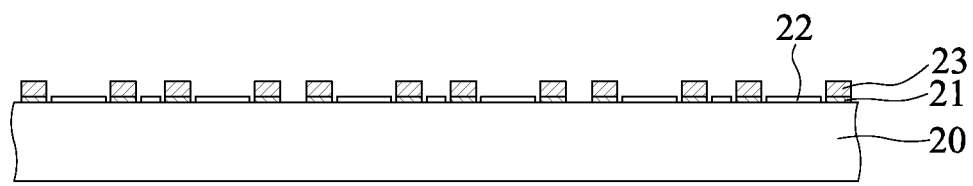
Figure 2C:
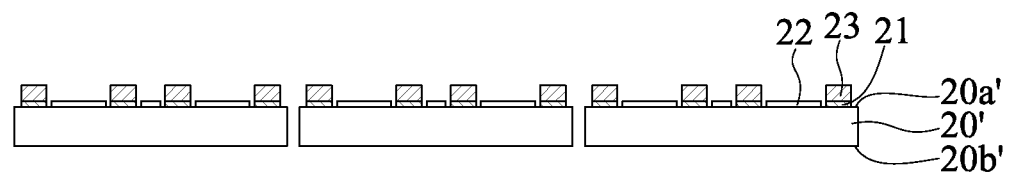

Generally, the present invention is divided into three phases. Firstly, a plurality of semiconductor chips are prepared. FIGS. 2A to 2C show a semiconductor chip of a semiconductor package structure and a method of fabricating the same according to the present invention.

Referring to FIG. 2A, a semiconductor wafer 20 having an active surface 20a and an opposite inactive surface 20b is provided, and a plurality of electrode pads 21 and a buffer layer 22 are formed on the active surface 20a of the semiconductor wafer 20.

Referring to FIG. 2B, a plurality of metal bumps 23 are disposed on the electrode pads 21, respectively.

Referring to FIG. 2C, the semiconductor wafer 20 is thinned from the inactive surface 20 thereof and is singulated into a plurality of semiconductor chips 20'. Each of the semiconductor chips 20' has an active surface 20a' and an opposite inactive surface 20b', a plurality of electrode pads 21 and a buffer layer 22 are formed on the active surface 20a', and a plurality of metal bumps 23 are disposed on the electrode pads 21, respectively.

Secondly, a metal foil is prepared. FIGS. 3A to 3D are cross-sectional views illustrating a metal foil of a semiconductor package structure and a method of fabricating the same according to the present invention.

Figure 3A:
FIGS. 3A to 3D are cross-sectional views illustrating a metal foil of a semiconductor package structure and a method of fabricating the same according to the present invention.

Referring to FIG. 3A, a metal board 30 made of, for example, copper is prepared.

Figure 3B:
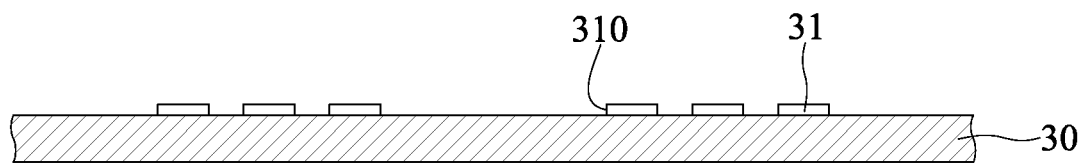

Referring to FIG. 3B, a resist layer 31 that has a plurality of patterned opening areas 310 is formed on the metal board 30, allowing portions of the metal board 30 to be exposed from the patterned opening areas 310.

Figure 3C:
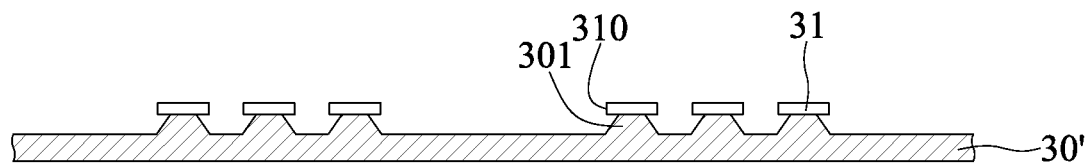

Referring to FIG. 3C, the exposed portions of the metal board 30 in the patterned opening areas 310 are etched, thus forming a metal foil 30' and a plurality of metal posts 301 disposed thereon.

Figure 3D:
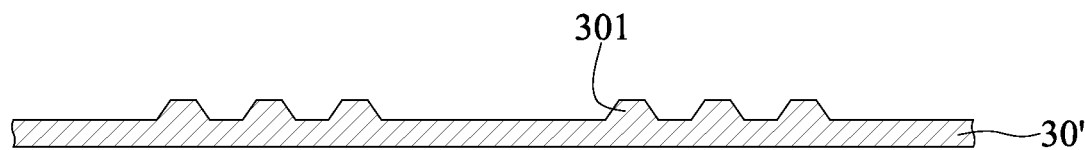

Referring to FIG. 3D, the resist layer 31 is removed.

Finally, assembling and packaging processes are performed, as shown in FIGS. 4A to 4K, which are cross-sectional views of a semiconductor package structure and a method of fabricating the same according to the present invention.

Figure 4A:
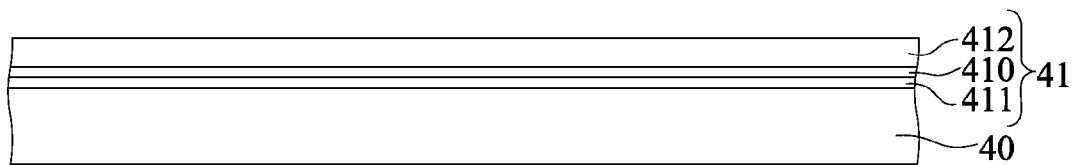
FIGS. 4A to 4K are cross-sectional views illustrating a semiconductor package structure and a method of fabricating the same according to the present invention.

Referring to FIG. 4A, a carrier board 40 is provided, which has a second adhesive layer 411, a plastic film 410 and a first adhesive layer 412 sequentially formed on a surface thereof. In an embodiment, the second adhesive layer 411, the plastic film 410 and the first adhesive layer 412 may constitute a double-sided adhesive layer 41 first, and then the double-sided adhesive layer 41 is adhered to the carrier board 40.

Figure 4B:
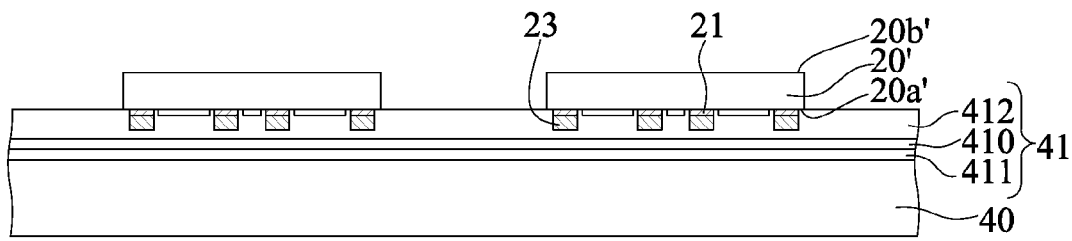

Referring to FIG. 4B, the plurality of semiconductor chips 20' are adhered to the first adhesive layer 412 through the active surfaces 20a' thereof with the metal bumps 23.

Figure 4C:
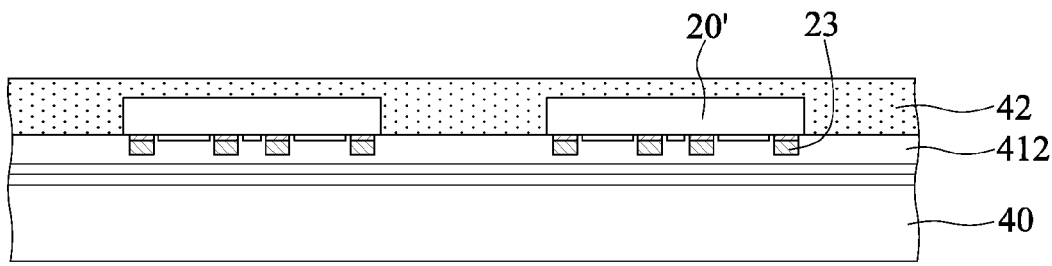

Referring to FIG. 4C, an encapsulant 42 is formed on the first adhesive layer 412 to encapsulate the semiconductor chips 20'.

Figure 4D:
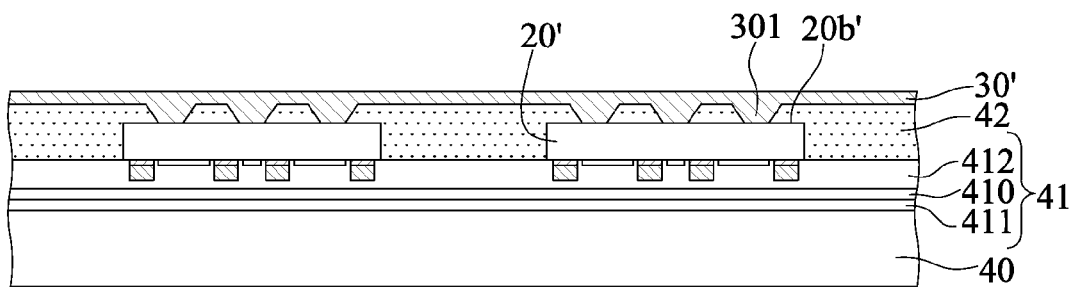

Referring to FIG. 4D, the metal foil 30' is attached to the encapsulant 42 through the surface thereof having the metal posts 301 such that the metal posts 301 penetrate the encapsulant 42 and are connected to the inactive surfaces 20b' of the semiconductor chips 20' for dissipating heat generated by the semiconductor chips 20'. It should be noted that it is not necessary for the metal posts 301 to come into contact with the inactive surfaces 20b' of the semiconductor chips 20'. For example, even if the metal posts 301 are 50-300 μm away from the inactive surface 20b', the metal posts 301 can still dissipate heat.

Figure 4E:
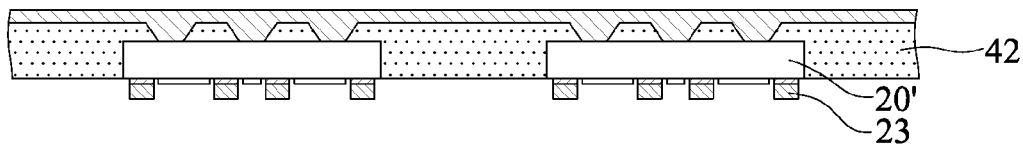

Referring to FIG. 4E, the carrier board 40 and the double-sided adhesive layer 41 are removed.

Figure 4F:
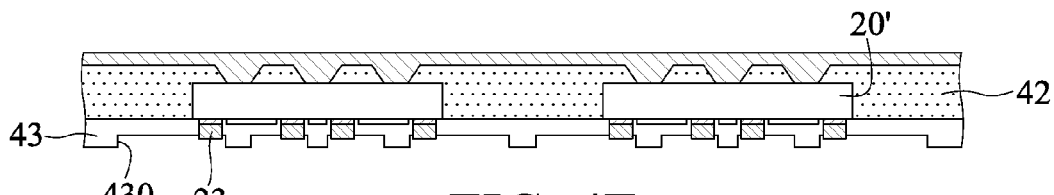

Referring to FIG. 4F, a dielectric layer 43 is formed on the encapsulant 42 and the semiconductor chips 20', and has a plurality of patterned intaglios 430 formed therein for exposing the metal bumps 23, respectively.

Figure 4G:
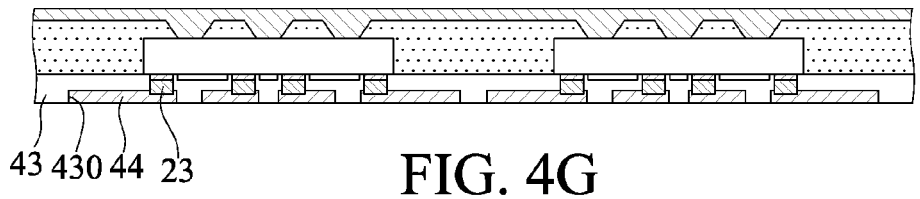

Referring to FIG. 4G a wiring layer 44 that is electrically connected to the metal bumps 23 is formed in the patterned intaglios 430 of the dielectric layer 43.

Figure 4H:
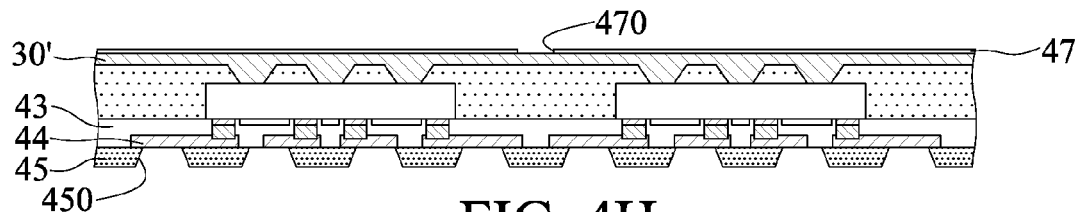

Referring to FIG. 4H, an insulating protective layer 45 is formed on the dielectric layer 43 and the wiring layer 44 and has a plurality of openings 450 for exposing portions of the wiring layer 44. Further, a cap layer 47 is formed on the metal foil 30' and is separated corresponding to the semiconductor chips 20' to form dicing lines 470 for exposing portions of the metal foil 30'. The cap layer 47 can be made of an insulating material or a metallic material.

Figure 4I:
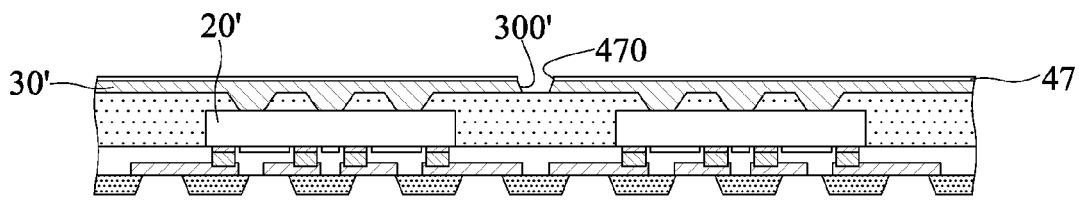

Referring to FIG. 4I, the portions of the metal foil 30' exposed from the dicing lines 470 of the cap layer 47 are removed to form dicing lines 300' such that the metal foils 30' is separated corresponding to the semiconductor chips 20'.

Figure 4J:
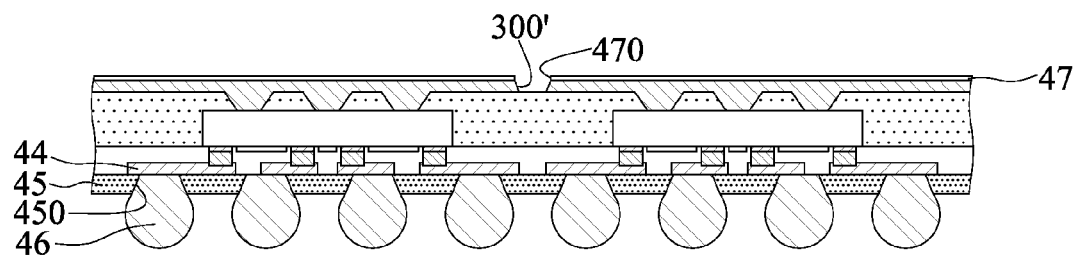

Referring to FIG. 4J, a plurality of solder balls 46 are disposed on the portions of the wiring layer 44 exposed from the openings 450 of the insulating protective layer 45.

Figure 4K:
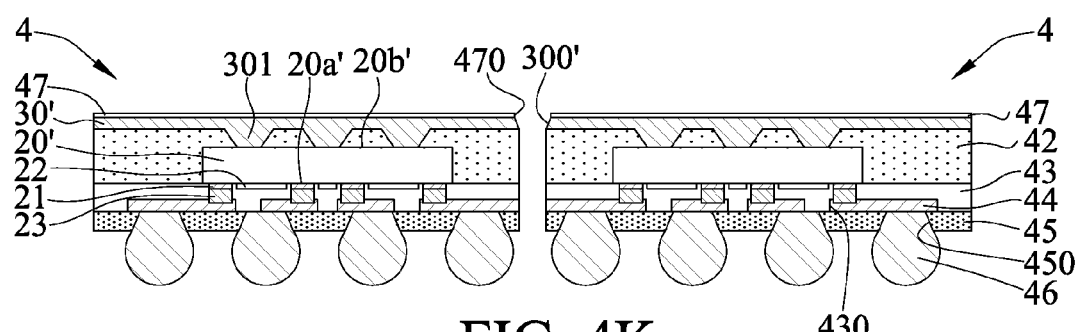

Referring to FIG. 4K, the encapsulant 42, the dielectric layer 43 and the insulating protective layer 45 are cut along the dicing lines 300' of the metal foil 30' such that a plurality of semiconductor package structures 4 are formed.

The present invention further discloses a semiconductor package structure, which has: a semiconductor chip 20' having an active surface 20a' and an opposite inactive surface 20b', a plurality of electrode pads 21 formed on the active surface 20a', and a plurality of metal bumps 23 disposed on the electrode pads 21, respectively; an encapsulant 42 encapsulating the semiconductor chip 20', with the active surface 20a' of the semiconductor chip 20' exposed therefrom; a dielectric layer 43 formed on the active surface 20a' of the semiconductor chip 20' and the encapsulant 42 and having a plurality of patterned intaglios 430 formed therein for exposing the metal bumps 23; a wiring layer 44 formed in the patterned intaglios 430 of the dielectric layer 43 and electrically connected to the metal bumps 23, wherein the wiring layer 44 extends to an area greater than the active surface 20a' of the semiconductor chip 20' by means of the presence of the encapsulant 42 and the dielectric layer 43; an insulating protective layer 45 formed on the dielectric layer 43 and the wiring layer 44 and having a plurality of openings 450 for exposing portions of the wiring layer 44; and a metal foil 30' having a plurality of metal posts 301 disposed on a surface thereof, wherein the metal foil 30' is disposed on the encapsulant 42 with the metal posts 301 penetrating the encapsulant 42 such that the metal posts 301 extend to the inactive surface 20b' of the semiconductor chip 20', thereby effectively dissipating heat generated by the semiconductor chip 20' to the ambient.

The above-described semiconductor package structure can further have a cap layer 47 formed on a top surface of the metal foil 30'. The cap layer 47 can be made of an insulating material or a metallic material.

The semiconductor package structure can further have a plurality of solder balls 46 disposed on the portions of the wiring layer 44 exposed from the openings 450 of the insulating protective layer 45.

The semiconductor package structure can further have a buffer layer 22 formed on the active surface 20a' of the semiconductor chip 20'.

Since the present invention uses the dielectric layer as the base of the semiconductor package structure and eliminates the need to use gold wires for electrical transmission as in the prior art, the overall thickness of the semiconductor package structure is reduced. Further, the metal posts extending to the inactive surface of the semiconductor chip can directly transfer heat generated by the semiconductor chip to the metal foil having a large area, thereby facilitating heat dissipation of the overall semiconductor package. Furthermore, by dispensing with the conventional long gold wires for electrical signal transmission, the present invention increases the electrical transmission efficiency, improves the reliability of final products and reduces material costs.

The above-described descriptions of the detailed embodiments are provided to illustrate the preferred implementation according to the present invention, and are not intended to limit the scope of the present invention. Accordingly, many modifications and variations completed by those with ordinary skill in the art will fall within the scope of present invention as defined by the appended claims.

What is claimed is:

1. A semiconductor package structure, comprising:
a semiconductor chip having an active surface and an opposite inactive surface, a plurality of electrode pads formed on the active surface, and a plurality of metal bumps disposed on the electrode pads, respectively;
an encapsulant encapsulating the semiconductor chip, with the active surface of the semiconductor chip being exposed therefrom;
a dielectric layer formed on the active surface of the semiconductor chip and the encapsulant and having a plurality of patterned intaglios for exposing the metal bumps;
a wiring layer formed in the patterned intaglios of the dielectric layer and electrically connected to the metal bumps, wherein the wiring layer extends to an area greater than the active surface of the semiconductor chip by means of the presence of the encapsulant and the dielectric layer;
an insulating protective layer formed on the dielectric layer and the wiring layer and having a plurality of openings for exposing portions of the wiring layer; and
a metal foil having a plurality of metal posts disposed on a surface thereof, wherein the metal foil is disposed on the encapsulant with the metal posts penetrating the encapsulant so as to extend to the inactive surface of the semiconductor chip, thereby effectively dissipating heat generated by the semiconductor chip to the ambient.

2. The structure of claim 1, further comprising a cap layer formed on a top surface of the metal foil.

3. The structure of claim 2, wherein the cap layer is made of an insulating material or a metallic material.

4. The structure of claim 1, further comprising a plurality of solder balls disposed on the portions of the wiring layer exposed from the openings of the insulating protective layer.

5. The structure of claim 1, further comprising a buffer layer formed on the active surface of the semiconductor chip.

* * * * *